US009489885B2

(12) United States Patent
Jeon et al.

(10) Patent No.: US 9,489,885 B2
(45) Date of Patent: Nov. 8, 2016

(54) ORGANIC LIGHT EMITTING DIODE DISPLAY

(71) Applicant: Samsung Display Co., Ltd., Yongin, Gyeonggi-do (KR)

(72) Inventors: Mu-Kyung Jeon, Yongin (KR); Tae-Joon Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 390 days.

(21) Appl. No.: 13/804,474

(22) Filed: Mar. 14, 2013

(65) Prior Publication Data

US 2014/0098078 A1 Apr. 10, 2014

(30) Foreign Application Priority Data

Oct. 8, 2012 (KR) ........................ 10-2012-0111339

(51) Int. Cl.
*H01L 27/32* (2006.01)
*G09G 3/32* (2016.01)

(52) U.S. Cl.
CPC ......... *G09G 3/3208* (2013.01); *H01L 27/3265* (2013.01); *H01L 27/3276* (2013.01); *G09G 3/3233* (2013.01); *G09G 2300/0426* (2013.01); *G09G 2300/0819* (2013.01); *G09G 2300/0852* (2013.01); *G09G 2300/0861* (2013.01); *H01L 27/3262* (2013.01)

(58) Field of Classification Search
CPC ................. G09G 3/3208; G09G 2300/0426; G09G 2300/0819; G09G 2300/0852; G09G 2300/0861; G09G 3/3233; H01L 27/3265; H01L 27/3276

See application file for complete search history.

(56) References Cited

U.S. PATENT DOCUMENTS

| | | | |
|---|---|---|---|
| 2008/0007492 A1* | 1/2008 | Koh | H01L 27/3276 345/76 |
| 2010/0052517 A1* | 3/2010 | Kim | H05B 33/26 313/504 |
| 2011/0024756 A1* | 2/2011 | Lee | 257/59 |
| 2012/0001896 A1* | 1/2012 | Han et al. | 345/214 |
| 2013/0257839 A1* | 10/2013 | Hyeon et al. | 345/212 |

FOREIGN PATENT DOCUMENTS

| | | |
|---|---|---|
| KR | 10-2006-0038257 | 5/2006 |
| KR | 10-0823199 | 4/2008 |
| KR | 10-2009-0108976 | 10/2009 |

* cited by examiner

*Primary Examiner* — Claire X Pappas
*Assistant Examiner* — Richard Hong
(74) *Attorney, Agent, or Firm* — Knobbe Martens Olson & Bear LLP (57) ABSTRACT

An organic light emitting diode (OLED) display includes: a substrate; a scan line formed on the substrate and that transfers a scan signal; a data line and a driving voltage line that intersect the scan line and that transfer a data signal and a driving voltage, respectively; a switching thin film transistor (TFT) connected to the scan line and the data line; a driving TFT connected to the switching TFT and the driving voltage line; an OLED connected to the driving TFT; a storage capacitor connected between the driving voltage line and a driving gate electrode of the driving TFT; and a boosting capacitor connected to the storage capacitor, wherein the storage capacitor has at least one capacitor opening.

15 Claims, 6 Drawing Sheets

ORGANIC LIGHT EMITTING DIODE DISPLAY

CROSS-REFERENCE TO RELATED APPLICATIONS

This application claims priority to and the benefit of Korean Patent Application No. 10-2012-0111339 filed in the Korean Intellectual Property Office on Oct. 8, 2012, the entire contents of which are incorporated herein by reference.

BACKGROUND

1. Field

The described technology relates generally to an organic light emitting diode (OLED) display.

2. Description of the Related Technology

An OLED display includes two electrodes and an organic emission layer that is positioned therebetween. Electrons that are injected from one electrode and holes that are injected from the other electrode form excitons by coupling in the organic emission layer, and the excitons emit light while discharging energy.

Such an OLED display includes a plurality of pixels including an OLED, which is a self-luminance element. At each pixel, a plurality of thin film transistors (TFT) and at least one capacitor for driving the OLED are formed. The plurality of TFTs include a switching TFT and a driving TFT.

The capacitor includes a storage capacitor that stores a data signal and a boosting capacitor that performs a boosting operation according to a voltage change of a signal line in order to more accurately express grayscales. Luminance of a pixel including the storage capacitor and the boosting capacitor changes according to a capacitance ratio of the two capacitors.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide an OLED display having advantages of being capable of preventing a stain due to a capacitance deviation between a storage capacitor and a boosting capacitor that are provided in a plurality of pixels.

One embodiment provides an OLED display including: a substrate; a scan line formed over the substrate and configured to transfer a scan signal; a data line and a driving voltage line that intersect the scan line and that are configured to transfer a data signal and a driving voltage, respectively; a switching thin film transistor (TFT) connected to the scan line and the data line; a driving TFT connected to the switching TFT and the driving voltage line, the driving TFT including a driving gate electrode; an OLED that is connected to the driving TFT; a storage capacitor connected between the driving voltage line and the driving gate electrode; and a boosting capacitor connected to the storage capacitor, wherein the storage capacitor has at least one capacitor opening.

The driving TFT may include a driving semiconductor layer formed over the substrate; the driving gate electrode formed on a first gate insulating layer and a second gate insulating layer that sequentially cover the driving semiconductor layer, the driving gate electrode overlapped with the driving semiconductor layer.

The storage capacitor may include a first storage capacitor plate formed over the first gate insulating layer; a second gate insulating layer covering the first storage capacitor plate; and a second storage capacitor plate formed over the second gate insulating layer and overlapped with the first storage capacitor plate.

The capacitor opening may be formed in the second storage capacitor plate.

The OLED may further include an interlayer insulating layer covering the second storage capacitor plate, wherein the driving gate electrode is connected to the first storage capacitor plate through a contact hole positioned within the capacitor opening and formed in the interlayer insulating layer and the second gate insulating layer.

The driving voltage line may be formed over the interlayer insulating layer and spaced apart from the capacitor opening.

A first side separation terminal and a second side separation terminal of the driving voltage line may be connected to the second storage capacitor plate through a first side contact hole and a second side contact hole, respectively, that are formed in the interlayer insulating layer.

The OLED display may further include a connection member formed in the same layer, and configured to be parallel to the driving voltage line, and further configured to connect the driving gate electrode and the first storage capacitor plate.

A first end of the connection member may be connected to the driving gate electrode through a contact hole formed in the interlayer insulating layer, and a first intermediate protruding portion of the connection member may be connected to the first storage capacitor plate through a contact hole formed in the interlayer insulating layer and the second gate insulating layer.

The OLED display may further include an initialization TFT configured to be turned on according to a previous scan signal received through a previous scan line and further configured to transfer an initialization voltage to a driving gate electrode of the driving TFT, wherein a second end of the connection member may be connected to an initialization semiconductor layer of the initialization TFT through a contact hole formed in the interlayer insulating layer, the second gate insulating layer, and the first gate insulating layer.

The OLED display may further include a compensating TFT configured to compensate a threshold voltage of the driving TFT and connected to the driving TFT, wherein a second intermediate protruding portion of the connection member may be connected to a compensation semiconductor layer of the compensation TFT through a contact hole formed in the interlayer insulating layer, the second gate insulating layer, and the first gate insulating layer.

The boosting capacitor may include a first boosting capacitor plate extended from the first storage capacitor and a second boosting capacitor plate overlapped with the first boosting capacitor plate and protruded from the scan line.

The scan line and the driving gate electrode may be formed co-planar with the second storage capacitor plate.

The previous scan line may be formed co-planar with the first storage capacitor plate.

The first storage capacitor plate may be formed co-planar with the first boosting capacitor plate, and the second storage capacitor plate may be formed co-planar with the second boosting capacitor plate.

According to one embodiment, because a storage capacitor has at least one capacitor opening, a capacitance ratio of a storage capacitor and a boosting capacitor can be uniformly sustained even in an over-etching phenomenon. Therefore, because a deviation does not occur in a capacitance ratio between a storage capacitor and a boosting capacitor that are provided in a plurality of pixels, a stain can be prevented from occurring.

Further, by separating a driving voltage line from a position corresponding to a capacitor opening, connecting one side separation terminal and the other side separation terminal of the driving voltage line to the second storage capacitor plate through a first side contact hole and a second side contact hole, respectively, that are formed in an interlayer insulating layer, connecting a first storage capacitor plate and a driving gate electrode that are exposed through a capacitor opening using a connection member, a capacitor opening can be formed within the storage capacitor.

DETAILED DESCRIPTION OF CERTAIN INVENTIVE EMBODIMENTS

The present invention will be described more fully hereinafter with reference to the accompanying drawings, in which certain embodiments of the invention are shown. As those skilled in the art would realize, the described embodiments may be modified in various ways, without departing from the spirit or scope of the present invention.

The drawings and description are to be regarded as illustrative in nature and not restrictive. Like reference numerals generally designate like elements throughout the specification.

Further, in the drawings, a size and thickness of each element are represented for better understanding and ease of description, and the present invention is not limited thereto.

In the drawings, the thickness of layers, films, panels, regions, etc., may be exaggerated for clarity. In the drawings, for better understanding and ease of description, thicknesses of some layers and areas may be excessively displayed. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements.

Further, in the specification, an upper part of a target portion indicates an upper part or a lower part of the target portion, and the target portion is not always positioned at the upper side based on a gravity direction.

Further, in the attached drawings, an active matrix (AM) OLED display of a 6Tr 2Cap structure having 6 TFTs and two capacitors at one pixel is illustrated, but the present invention is not limited thereto. Therefore, the OLED display may have a plurality of TFTs and at least one capacitor at one pixel, and as a separate wire is further formed or an existing wire is omitted, the OLED display may be formed to have various structures. Here, a pixel is a minimum unit that displays an image, and the OLED display displays an image through a plurality of pixels.

Hereinafter, an OLED display according to one embodiment will be described in detail with reference to FIGS. 1 to 5.

In order to express uniform luminance, a capacitance ratio of a storage capacitor and a boosting capacitor should be uniformly sustained between a plurality of pixels. When a deviation occurs in the capacitance ratio, a stain occurs by a luminance deviation and a color deviation. Particularly, because an area of the boosting capacitor is smaller than that of the storage capacitor, a micro over-etching phenomenon, i.e., a skew in a production process has a large influence on an area of the boosting capacitor and thus a stain may occur at a pixel.

Figure 1:
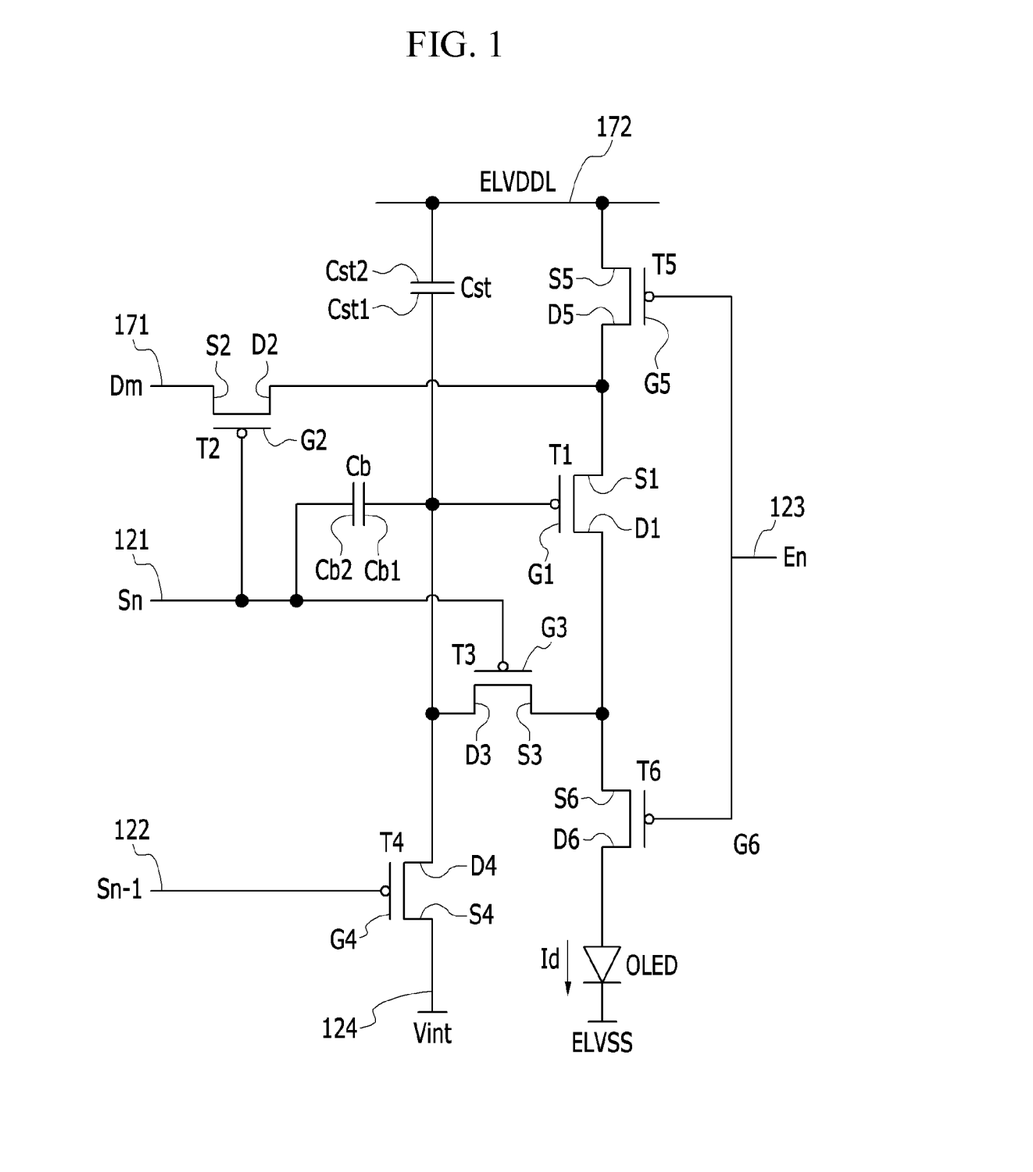
FIG. 1 is an equivalent circuit diagram of one pixel of an OLED display according to one embodiment.

FIG. 1 is an equivalent circuit diagram of one pixel of an OLED display according to one embodiment.

As shown in FIG. 1, one pixel of an OLED display according to an embodiment includes a plurality of signal lines 121, 122, 123, 124, 171, and 172, a plurality of TFTs T1, T2, T3, T4, T5, and T6 that are connected to the plurality of signal lines, capacitors Cst and Cb, and an OLED.

The TFTs includes a driving TFT T1, a switching TFT T2, a compensation TFT T3, and an initialization TFT T4, an operation control TFT T5, and a light emission control TFT T6, and the capacitors include a storage capacitor Cst and a boosting capacitor Cb.

The signal lines includes a scan line 121 that transfers a scan signal Sn to the switching TFT T2 and the boosting capacitor Cb, a previous scan line 122 that transfers a previous scan signal Sn-1 to the initialization TFT T4, a light emission control line 123 that transfers a light emission control signal En to the operation control TFT T5 and the light emission control TFT T6, a data line 171 that intersects the scan line 121 and that transfers a data signal Dm, a driving voltage line 172 that transfers a driving voltage ELVDD and that is formed substantially parallel to the data line 171, and an initialization voltage line 124 that transfers an initialization voltage Vint that initializes the driving TFT T1.

A gate electrode G1 of the driving TFT T1 is connected to one end Cst1 of a storage capacitor Cst. A source electrode S1 of the driving TFT T1 is connected to the driving voltage line 172 via the operation control TFT T5. A drain electrode D1 of the driving TFT T1 is electrically connected to an anode of the OLED via the light emission control TFT T6. The driving TFT T1 receives a data signal Dm according to a switching operation of the switching TFT T2 and supplies a driving current Id to the OLED.

A gate electrode G2 of the switching TFT T2 is connected to the scan line 121, the other end Cb2 of the boosting capacitor Cb, and a gate electrode G3 of the compensation TFT T3. A source electrode S2 of the switching TFT T2 is connected to the data line 171. A drain electrode D2 of the switching TFT T2 is connected to the driving voltage line 172 via the operation control TFT T5 while being connected to a source electrode S1 of the driving TFT T1. The switching TFT T2 is turned on according to a scan signal Sn received through the scan line 121, and performs a switching operation that transfers a data signal Dm to the source electrode S1 of the driving TFT T1.

A gate electrode G3 of the compensation TFT T3 is connected to the scan line 121, the gate electrode G2 of the switching TFT T2, the other end Cb2 of the boosting capacitor Cb. A source electrode S3 of the compensation TFT T3 is connected to an anode of the OLED via the light emission control TFT T6 while being connected to a drain electrode D1 of the driving TFT T1. A drain electrode D3 of the compensation TFT T3 is connected to one end Cst1 of the capacitor Cst, one end Cb1 of the boosting capacitor Cb, a gate electrode G1 of the driving TFT T1, and a drain electrode D4 of the initialization TFT T4. The compensation TFT T3 is turned on according to a scan signal Sn received through the scan line 121 to connect a gate electrode G1 and a drain electrode D1 of the driving TFT T1, and to perform a diode-connection of the driving TFT T1.

A gate electrode G4 of the initialization TFT T4 is connected to the previous scan line 122. A source electrode S4 of the initialization TFT T4 is connected to the initialization voltage line 124. A drain electrode D4 of the initialization TFT T4 is connected to one end Cb1 of the boosting capacitor Cb, one end Cst1 of the storage capacitor Cst, a drain electrode D3 of the compensation TFT T3, and a gate electrode G1 of the driving TFT T1. The initialization TFT T4 is turned on according to the previous scan signal Sn-1 received through the previous scan line 122, transfers an initialization voltage Vint to the gate electrode G1 of the driving TFT T1, and performs an initialization operation that initializes a voltage of the gate electrode G1 of the driving TFT T1.

A gate electrode G5 of the operation control TFT T5 is connected to the light emitting control line 123. A source electrode S5 of the operation control TFT T5 is connected to the driving voltage line 172. A drain electrode D5 of the operation control TFT T5 is connected to the source electrode S1 of the driving TFT T1 and the drain electrode S2 of the switching TFT T2.

A gate electrode G6 of the light emitting control TFT T6 is connected to the light emitting control line 123. A source electrode S6 of the light emitting control TFT T6 is connected to a drain electrode D1 of the driving TFT T1 and a source electrode S3 of the compensation TFT T3. A drain electrode D6 of the light emitting control TFT T6 is electrically connected to an anode of the OLED. The operation control TFT T5 and the light emission control TFT T6 are turned on according to the light emission control signal En received through the light emission control line 123 and thus a driving voltage ELVDD is transferred to the OLED to enable a driving current Id to flow to the OLED.

The other end Cst2 of the storage capacitor Cst is connected to the driving voltage line 172, and a cathode of the OLED is connected to a common voltage ELVSS. Accordingly, the OLED receives a driving current Id from the driving TFT T1 and emits light, thereby displaying an image.

Hereinafter, a specific operation process of one pixel of an OLED display according to an y embodiment will be described in detail.

First, for an initialization period, the previous scan signal Sn-1 of a low level is supplied through the previous scan line 122. Therefore, the initialization TFT T4 is turned on to correspond to the previous scan signal Sn-1 of a low level, the initialization voltage Vint is connected from the initialization voltage line 124 to the gate electrode G1 of the driving TFT T1 through the initialization TFT T4, and the driving TFT T1 is initialized by the initialization voltage Vint.

Thereafter, for a data programming period, a scan signal Sn of a low level is supplied through the scan line 121. Therefore, the switching TFT T2 and the compensation TFT T3 are turned on to correspond to the scan signal Sn of a low level.

In this case, the driving TFT T1 is diode-connected by the turned-on compensation TFT T3 and is biased in a forward direction.

Therefore, a compensation voltage (Dm+Vth) (where Vth is a negative (−) value) that is reduced by a threshold voltage Vth of the driving TFT T1 from a data signal Dm that is supplied from the data line 171 is applied to the gate electrode G1 of the driving TFT T1.

The driving voltage ELVDD and a compensation voltage Dm+Vth are applied to both ends of the storage capacitor Cst, and charges corresponding to a voltage difference between the two ends of the capacitor are stored at the storage capacitor Cst.

Thereafter, while the supply of the scan signal Sn is stopped, when a voltage level of the scan signal Sn is changed to a high level, a voltage that is applied to the gate electrode G1 of the driving TFT T1 by a coupling operation of the boosting capacitor Cb is changed to correspond to a voltage change width of the scan signal Sn. In this case, because a voltage that is applied to the gate electrode G1 of the driving TFT T1 is changed by charge sharing between the storage capacitor Cst and the boosting capacitor Cb, a voltage change amount that is applied to the driving gate electrode G1 is changed proportional to a charge sharing value between the storage capacitor Cst and the boosting capacitor Cb together with a voltage change width of the scan signal Sn.

Thereafter, for a light emitting period, a light emission control signal En that is supplied from the light emission control line 123 is changed from a high level to a low level. Therefore, for a light emitting period, the operation control TFT T5 and the light emission control TFT T6 are turned on by the light emission control signal En of a low level.

Therefore, a driving current Id is generated according to a voltage difference between a voltage of the gate electrode G1 of the driving TFT T1 and the driving voltage ELVDD, and the driving current Id is supplied to the OLED through the light emission control TFT T6. For a light emitting period, a gate-source voltage Vgs of the driving TFT T1 is sustained to 'Dm+Vth−ELVDD' by the storage capacitor Cst, and a driving current Id is proportional to the square '$(Dm-ELVDD)^2$' of a value that subtracts a threshold voltage Vth from a gate-source voltage Vgs according to a current-voltage relationship of the driving TFT T1. Therefore, the driving current Id is determined regardless of the threshold voltage Vth of the driving TFT T1.

Hereinafter, a detailed structure of a pixel of the OLED display that is shown in FIG. 1 will be described in detail with reference to FIGS. 2 to 6.

Figure 2:
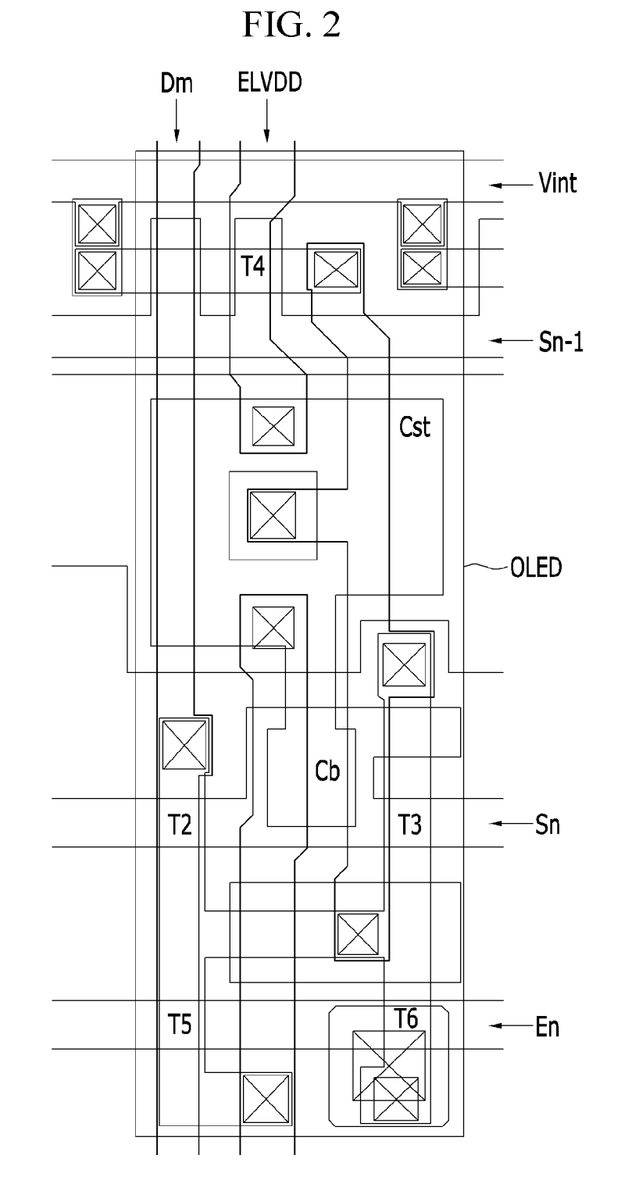
FIG. 2 is a diagram illustrating a position of a plurality of TFTs and a capacitor at one pixel of an OLED display according to one embodiment.
Figure 3:
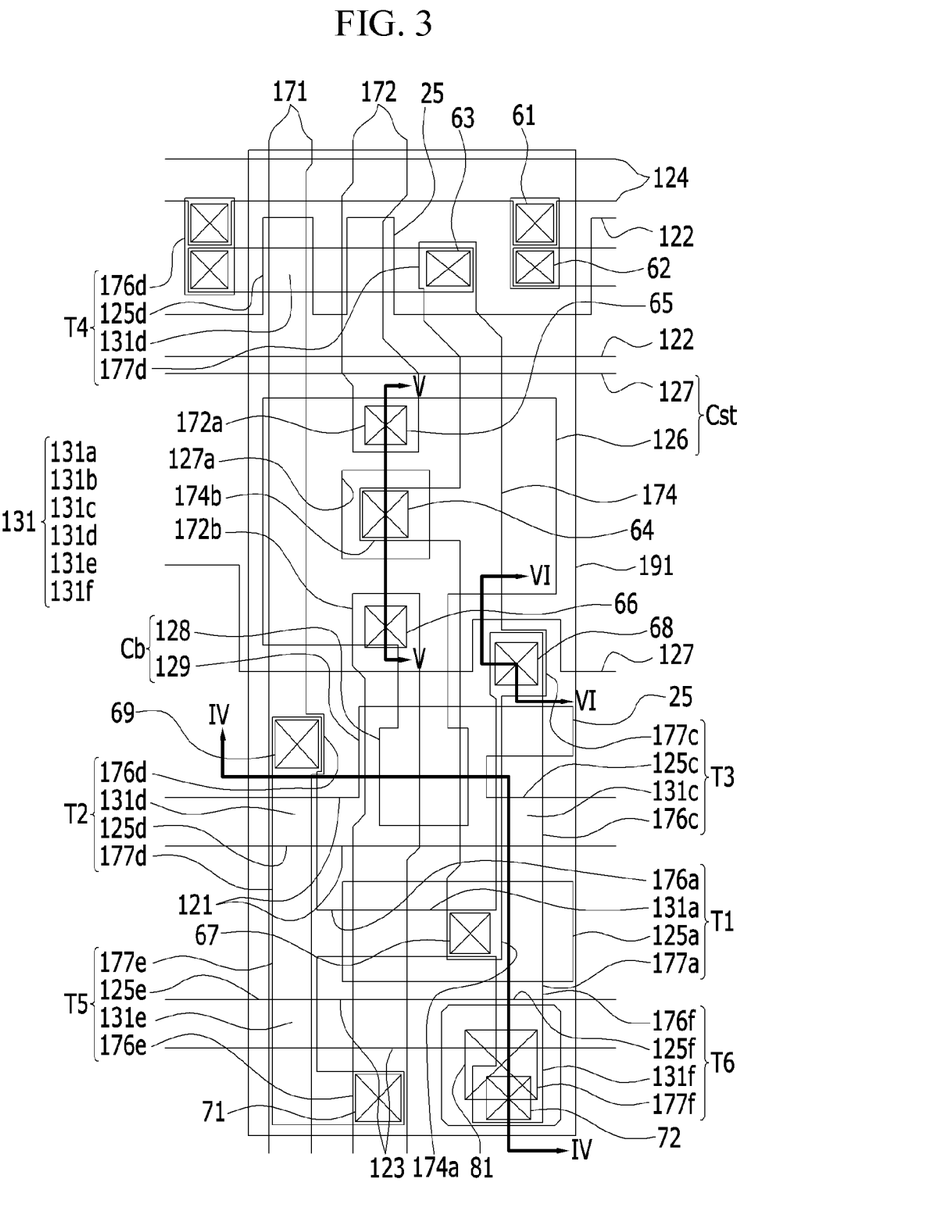
FIG. 3 is a specific layout view of one pixel of an OLED display according to one embodiment.
Figure 4:
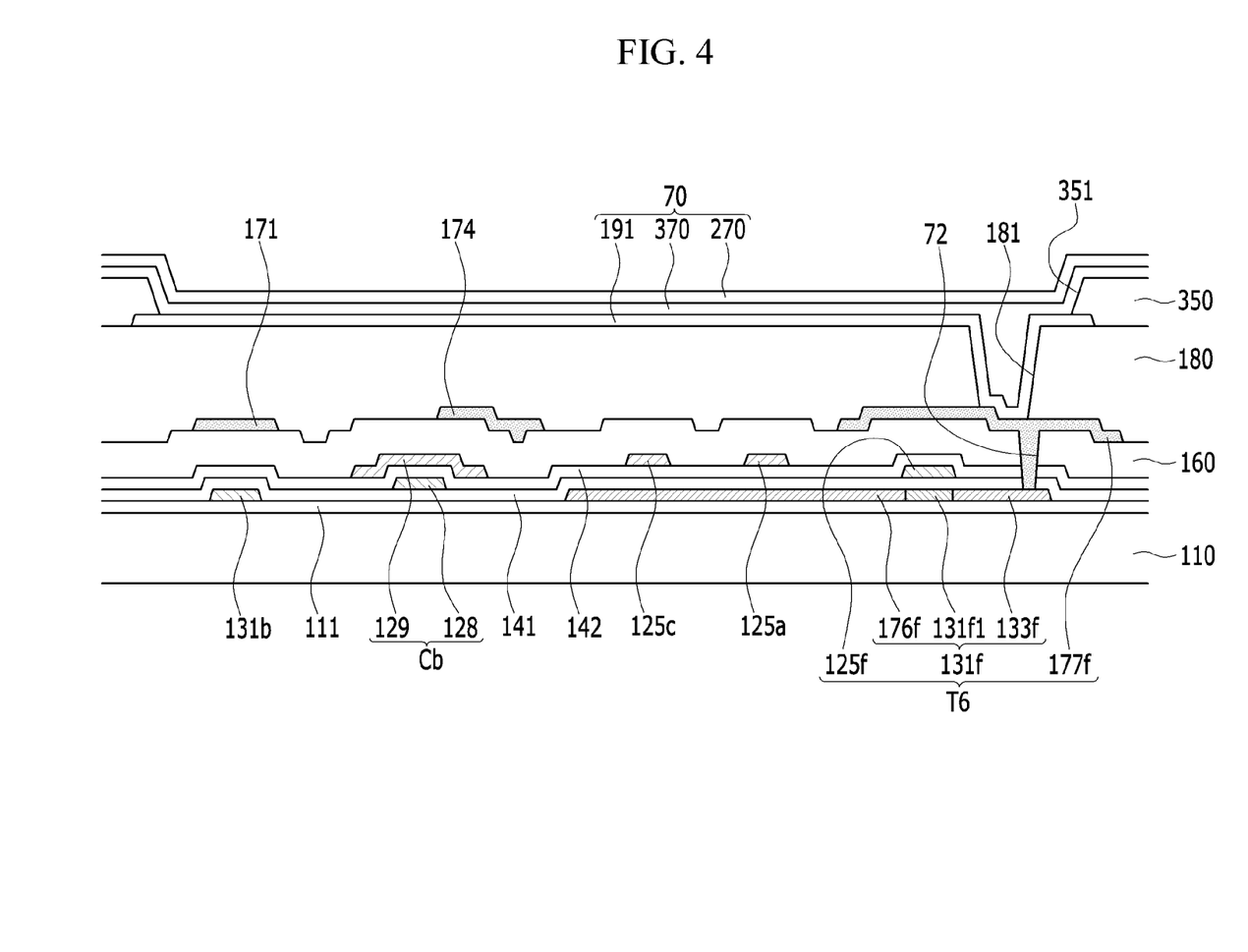
FIG. 4 is a cross-sectional view illustrating an OLED display taken along line IV-IV of FIG. 3.
Figure 5:
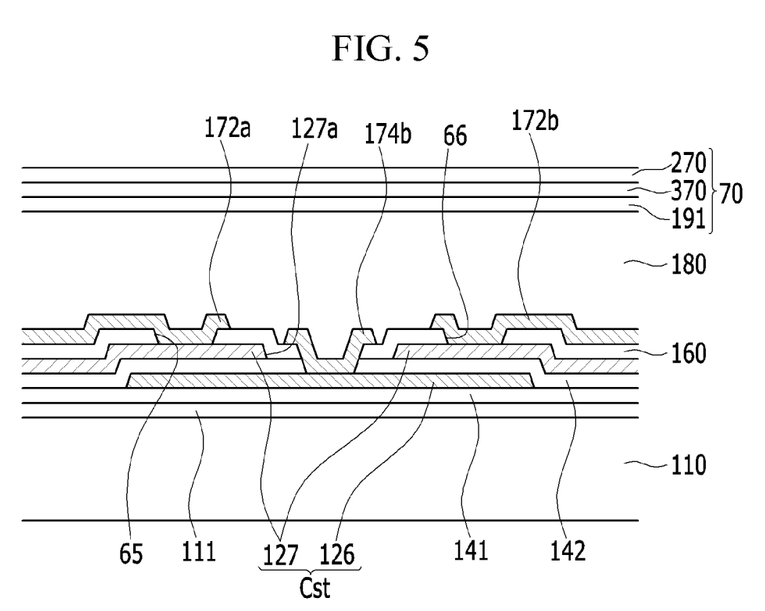
FIG. 5 is a cross-sectional view illustrating an OLED display taken along line V-V of FIG. 3.
Figure 6:
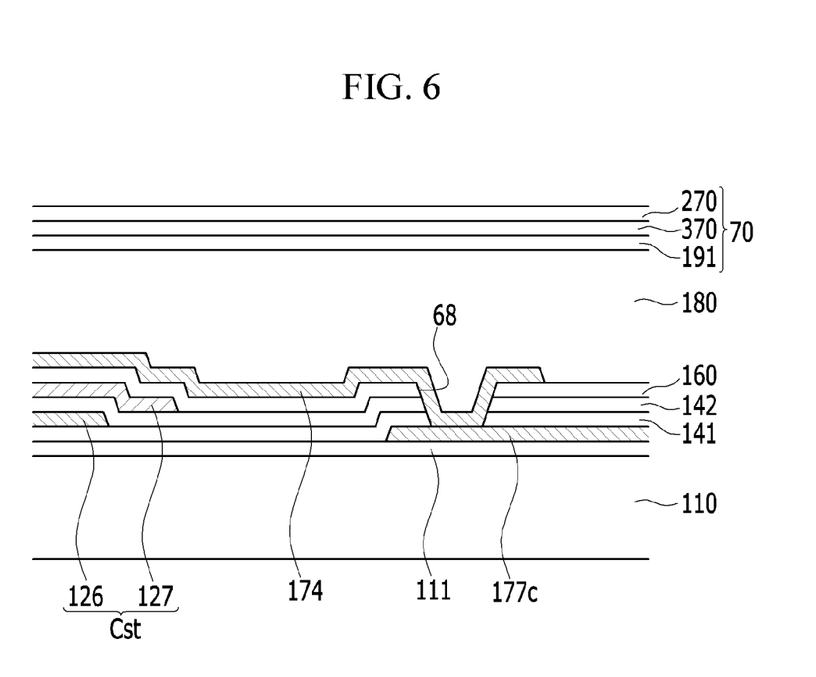
FIG. 6 is a cross-sectional view illustrating an OLED display taken along line VI-VI of FIG. 3.

FIG. 2 is a diagram illustrating a position of a plurality of TFTs and a capacitor at one pixel of an OLED display according to an embodiment, FIG. 3 is a specific layout view of one pixel of an OLED display according to an embodiment, FIG. 4 is a cross-sectional view illustrating an OLED display taken along line IV-IV of FIG. 3, FIG. 5 is a cross-sectional view illustrating an OLED display taken along line V-V of FIG. 3, and FIG. 6 is a cross-sectional view illustrating an OLED display taken along line VI-VI of FIG. 3.

As shown in FIGS. 2 to 6, a pixel of the OLED display according to an embodiment includes a scan line 121, a previous scan line 122, a light emission control line 123, and an initialization voltage line 124 that apply a scan signal Sn, a previous scan signal Sn-1, a light emission control signal En, and an initialization voltage Vint, respectively to the pixel, and that are formed in a row direction. The pixel of the OLED display also includes a data line 171 and a driving voltage line 172 that intersect all of the scan line 121, the previous scan line 122, the light emission control line 123, and the initialization voltage line 124, and that apply a data signal Dm and a driving voltage ELVDD, respectively, to the pixel.

Further, at the pixel, the driving TFT T1, the switching TFT T2, the compensation TFT T3, the initialization TFT T4, the operation control TFT T5, the light emission control TFT T6, the storage capacitor Cst, the boosting capacitor Cb, and an OLED 70 are formed.

The driving TFT T1, the switching TFT T2, the compensation TFT T3, the initialization TFT T4, the operation control TFT T5, and the light emission control TFT T6 are formed along a semiconductor layer 131, and the semiconductor layer 131 is bent in various shapes. Such a semiconductor layer 131 is made of polysilicon and includes a channel area in which impurities are not doped and a source area and a drain area that are doped with impurities at both sides of the channel area. Such impurities change according to a kind of a TFT and may be an N type impurity or a P type impurity. The semiconductor layer includes a driving semiconductor layer 131a that is formed in the driving TFT T1, a switching semiconductor layer 131b that is formed in the switching TFT T2, a compensation semiconductor layer 131c that is formed in the compensation TFT T3, an initialization semiconductor layer 131d that is formed in the initialization TFT T4, and an operation control semiconductor layer 131e and a light emission control semiconductor layer 131f that are formed in the operation control TFT T5 and the light emission control TFT T6, respectively.

The driving TFT T1 includes the driving semiconductor layer 131a, a driving gate electrode 125a, a driving source electrode 176a, and a driving drain electrode 177a. The driving source electrode 176a corresponds to a driving source area 176a that is doped with impurities in the driving semiconductor layer 131a, and the driving drain electrode 177a corresponds to a driving drain area 177a that is doped with impurities in the driving semiconductor layer 131a. The driving gate electrode 125a is overlapped with the driving semiconductor layer 131a and has a rectangular shape.

The driving gate electrode 125a is formed in the same layer and with the same material as that of the scan line 121, the initialization voltage line 124, a switching gate electrode 125b, a compensation gate electrode 125c, a second storage capacitor plate 127, and a second boosting capacitor plate 129.

The switching TFT T2 includes a switching semiconductor layer 131b, the switching gate electrode 125b, a switching source electrode 176b, and a switching drain electrode 177b. The switching drain electrode 177b corresponds to a switching drain area 177b that is doped with impurities in the switching semiconductor layer 131b.

The compensation TFT T3 includes a compensation semiconductor layer 131c, a compensation gate electrode 125c, a compensation source electrode 176c, and a compensation drain electrode 177c, and the compensation source electrode 176c corresponds to a compensation source area that is doped with impurities in the compensation semiconductor layer 131c. The compensation gate electrode 125c forms a separate dual gate electrode 25, thereby preventing a leakage current.

The initialization TFT T4 includes an initialization semiconductor layer 131d, an initialization gate electrode 125d, an initialization source electrode 176d, and an initialization drain electrode 177d. One end of the initialization source electrode 176d is connected to the initialization voltage line 124 through a contact hole 61 that is formed in the interlayer insulating layer 160, and the other end of the initialization source electrode 176d is connected to the initialization semiconductor layer 131d through a contact hole 62 that is continuously formed in the first gate insulating layer 141, the second gate insulating layer 142, and the interlayer insulating layer 160. The initialization drain electrode 177d is the other end of a connection member 174 and is connected to the initialization semiconductor layer 131d through the contact hole 63 that is continuously formed in the first gate insulating layer 141, the second gate insulating layer 142, and the interlayer insulating layer 160.

The operation control TFT T5 includes an operation control semiconductor layer 131e, an operation control gate electrode 125e, an operation control source electrode 176e, and an operation control drain electrode 177e. The operation control source electrode 176e is a portion of the driving voltage line 172, is connected to an operation control source area through a contact hole 71. The operation control drain electrode 177e corresponds to an operation control drain area 177e that is doped with impurities in the operation control semiconductor layer 131e.

The light emission control TFT T6 includes a light emission control semiconductor layer 131f, a light emission control gate electrode 125f, a light emission control source electrode 176f, and a light emission control drain electrode 177f. The light emission control source electrode 176f corresponds to a light emission control source area 176f that is doped with impurities in the light emission control semiconductor layer 131f.

One end of the driving semiconductor layer 131a of the driving TFT T1 is connected to the switching semiconductor layer 131b and the operation control semiconductor layer 131e, and the other end of the driving semiconductor layer 131a is connected to the compensation semiconductor layer 131c and the light emission control semiconductor layer 131f. Therefore, the driving source electrode 176a is connected to the switching drain electrode 177b and the operation control drain electrode 177e, and the driving drain electrode 177a is connected to the compensation source electrode 176c and the light emission control source electrode 176f.

As shown in FIG. 5, the storage capacitor Cst includes a first storage capacitor plate 126 and a second storage capacitor plate 127 that together interpose the second gate insulating layer 142 therebetween. The second gate insulating layer 142 is a dielectric material, and storage capacitance is determined by charges that are stored at the storage capacitor Cst and a voltage between both capacitor plates 126 and 127.

The first storage capacitor plate 126 is formed in the same layer and with the same material as that of the previous scan line 122, the light emission control line 123, the operation control gate electrode 125e, the light emission control gate electrode 125f, and the first boosting capacitor plate 128. The second storage capacitor plate 127 is formed in the same layer and with the same material as that of the scan line 121, the initialization voltage line 124, the driving gate electrode 125a, the switching gate electrode 125b, the compensation gate electrode 125c, and the second boosting capacitor plate 129. The first storage capacitor plate 126 and the second storage capacitor plate 127 are formed with a gate wire including at least one metal of aluminum (Al), chromium (Cr), molybdenum (Mo), titanium (Ti), tantalum (Ta), Al—Ni—La alloy, and Al—Nd alloy. Therefore, storage capacitance can be improved, compared with a structure that forms any one capacitor plate of the storage capacitor Cst with a semiconductor layer.

The storage capacitor Cst has at least one capacitor opening 127a, and specifically, a capacitor opening 127a is formed in the second storage capacitor plate 127. Therefore, because the inside of the storage capacitor Cst is over-etched together with the outside of the storage capacitor Cst by an over-etching phenomenon occurring in a production process, a skew area of the storage capacitor Cst is larger than that of the boosting capacitor Cb, and thus a capacitance ratio of the storage capacitor Cst and the boosting capacitor Cb may be uniformly sustained even in an over-etching phenomenon. Therefore, because a deviation does not occur at a capacitance ratio between the boosting capacitor Cb and the storage capacitor Cst, by minimizing a voltage deviation of the driving gate electrode 125a of the driving TFT T1, a stain is prevented from occurring.

The driving voltage line 172 passing through to overlap with the storage capacitor Cst is separated at a position at which the capacitor opening 127a is formed. The driving voltage line 172 includes one side separation terminal 172a that is positioned at one side based on the capacitor opening 127a and the other side separation terminal 172b that is positioned at the other side based on the capacitor opening 127a. One side separation terminal 172a and the other side separation terminal 172b of the driving voltage line 172 are connected to the second storage capacitor plate 127 through one side contact hole 65 and the other side contact hole 66, respectively, that are formed in the interlayer insulating layer 160.

The connection member 174 is formed in the same layer to be parallel to the driving voltage line 172. The connection member 174 connects the driving gate electrode 125a and the first storage capacitor plate 126. One end 174a of the connection member 174 is connected to the driving gate electrode 125a through the contact hole 67 that is formed in the interlayer insulating layer 160, and a first intermediate protruding portion 174b of the connection member 174 is connected to the first storage capacitor plate 126 through a contact hole 64 that is formed in the interlayer insulating layer 160 and the second gate insulating layer 142 that is positioned at the inside of the capacitor opening 127a.

The other end 177d of the connection member 174 corresponds to an initialization drain electrode 177d of the initialization TFT T4 and is connected to the initialization semiconductor layer 131d of the initialization TFT T4 through a contact hole 63 that is continuously formed in the first gate insulating layer 141, the second gate insulating layer 142, and the interlayer insulating layer 160. Further, the second intermediate protruding portion 177c of the connection member 174 corresponds to the compensation drain electrode 177c of the compensation TFT T3 and is connected to the compensation semiconductor layer 131c of the compensation TFT T3 through the contact hole 68 that is continuously formed in the first gate insulating layer 141, the second gate insulating layer 142, and the interlayer insulating layer 160.

Therefore, the first storage capacitor plate 126 of the storage capacitor Cst is connected to the compensation semiconductor layer 125c and an initialization semiconductor layer 125d through the second intermediate protruding portion 177c and the other end 177d of the connection member 174 and is connected to the driving gate electrode 125a through one end 174a of the connection member 174. The second storage capacitor plate 127 of the storage capacitor Cst is connected to the driving voltage line 172 through one side contact hole 65 and the other side contact hole 66 that is formed in the interlayer insulating layer 160.

Therefore, the storage capacitor Cst stores storage capacitance corresponding to a difference between a gate voltage of the driving gate electrode 125a and a driving voltage ELVDD that is transferred through the driving voltage line 172.

In this way, the driving voltage line 172 is separated from a position corresponding to the capacitor opening 127a, and one side separation terminal 172a and the other side separation terminal 172b of the driving voltage line 172 are connected to the second storage capacitor plate 127 through one side contact hole 65 and the other side contact hole 66, respectively, that are formed in the interlayer insulating layer 160 and connect the first storage capacitor plate 126 and the driving gate electrode 125a that are exposed through the capacitor opening 127a using the connection member 174, thereby forming the capacitor opening 127a at the inside of the storage capacitor Cst. In this case, an area and the number of the capacitor openings 127a that is formed in the storage capacitor Cst are determined by a capacitance ratio of the boosting capacitor Cb.

The first boosting capacitor plate 128 of the boosting capacitor Cb is extended from the first storage capacitor plate 126, and the second boosting capacitor plate 129 is protruded from the scan line 121. The first boosting capacitor plate 128 has a hammer shape, and a first boosting capacitor plate 133 includes a handle portion parallel to the driving voltage line 172 and a head portion that is formed in an end portion of the handle portion. The head portion of the first boosting capacitor plate 128 is positioned to overlap at the inside of the second boosting capacitor plate 129.

The switching TFT T2 is used as a switch that selects a pixel to emit light. The switching gate electrode 125b is connected to the scan line 121, the switching source electrode 176b is connected to the data line 171, and the switching drain electrode 177b is connected to the driving TFT T1 and the operation control TFT T5. The light emission control drain electrode 177f of the light emission control TFT T6 is directly connected to a pixel electrode 191 of the organic light emitting diode 70 through a contact hole 181 that is formed in a protective layer 180.

Hereinafter, a structure of an OLED display according to an embodiment will be described in detail with reference to FIGS. 4 to 6.

A structure of a TFT based on the driving TFT T1, the switching TFT T2, and the light emission control TFT T6 will be described, and a storage capacitor Cst and the connection member 174 will be described. The remaining TFTs T3, T4, and T5 have substantially the same stacked structure as that of the driving TFT T1, the switching TFT T2, and the light emission control TFT T6 and therefore a detailed description thereof will be omitted.

A buffer layer 111 is formed on a substrate 110, and the substrate 110 is formed as an insulation substrate that is formed with glass, quartz, ceramic, and plastic.

The switching semiconductor layer 131b, the driving semiconductor layer 131a, and the light emission control semiconductor layer 131f are formed on the buffer layer 111. The switching semiconductor layer 131b includes a switching source area and a switching drain area opposite to each other with a switching channel area interposed therebetween. The driving semiconductor layer 131a includes a driving source area and a driving drain area opposite to each other with a driving channel area interposed therebetween. The light emission control TFT T6 includes a light emission control channel area 131f1, a light emission control source area 176f, and a light emission control drain area 133f.

The first gate insulating layer 141 that is formed with silicon nitride SiNx or silicon oxide SiO2 is formed on the switching semiconductor layer 131a, the driving semiconductor layer 131b, and the light emission control semiconductor layer 131f.

The previous scan line 122 including an initialization gate electrode 125d, a light emission control line 123 including the operation control gate electrode 125e and the light emission control gate electrode 125f, and first gate wires 122, 123, 125d, 125e, 125f, 126, and 128 including the first storage capacitor plate 126, and the first boosting capacitor plate 128 are formed on the first gate insulating layer 141.

A second gate insulating layer 142 is formed on the first gate wires 122, 123, 125d, 125e, 125f, 126, and 128 and the first gate insulating layer 141. The second gate insulating layer 142 is made of silicon nitride SiNx or silicon oxide SiO2.

On the second gate insulating layer 142, a scan line 121 including the driving gate electrode 125a, the switching gate electrode 125b, and the compensation gate electrode 125c, the initialization voltage line 124, and the second gate wires 125a, 125b, 125c, 121, 124, 127, and 129 including the second storage capacitor plate 127 and the second boosting capacitor plate 129 are formed. A storage opening 127a for connecting the first storage capacitor plate 126 and the first intermediate protruding portion 174b of the connection member 174 is formed at the inside of the second storage capacitor plate 127.

The interlayer insulating layer 160 is formed on the second gate wires 125a, 125b, 125c, 121, 124, 127, and 129 and the second gate insulating layer 142. The interlayer insulating layer 160 is made of a ceramic-based material such as silicon nitride SiNx or silicon oxide SiO2, as in the first gate insulating layer 141 and the second gate insulating layer 142.

On the interlayer insulating layer 160, a data wire including a data line 171 including the switching source electrode 176b, the connection member 174 including the initialization drain electrode 177d and the compensation drain electrode 177c, and the driving voltage line 172 including the light emission control drain electrode 177f and the driving control source electrode 176e are formed.

The light emission control drain electrode 177f is connected to the light emission control drain area 133f of the light emission control semiconductor layer 131f through a contact hole 72 that is formed in the first gate insulating layer 141, the second gate insulating layer 142, and the interlayer insulating layer 160. The first intermediate protruding portion 174b of the connection member 174 is connected to the first storage capacitor plate 126 through the contact hole 64 that is continuously formed in the second gate insulating layer 142 and the interlayer insulating layer 160. One side separation terminal 172a and the other side separation terminal 172b of the driving voltage line 172 are connected to the second storage capacitor plate 127 through one side contact hole 65 and the other side contact hole 66, respectively, that are formed in the interlayer insulating layer 160. The second intermediate protruding portion 177c of the connection member 174 is connected to the compensation semiconductor layer 125c of the compensation TFT T3 through a contact hole 68 that is continuously formed in the first gate insulating layer 141, the second gate insulating layer 142, and the interlayer insulating layer 160.

The protective layer 180 that covers data wires 171, 172, 174, and 177f is formed on the interlayer insulating layer 160, and the pixel electrode 191 is formed on the protective layer 180. The pixel electrode 191 is connected to the light emission control drain electrode 177f through the contact hole 181 that is formed in the protective layer 180.

A barrier rib 350 is formed on the protective layer 180 and an edge of the pixel electrode 191, and the barrier rib 350 has a barrier rib opening 351 that exposes the pixel electrode 191. The barrier rib 350 may be made of a resin such as a polyacrylates resin and a polyimides resin or a silica-based inorganic material.

An organic emission layer 370 is formed on the pixel electrode 191 that is exposed by the barrier rib opening 351, and a common electrode 270 is formed on the organic emission layer 370. In this way, the OLED 70 including the pixel electrode 191, the organic emission layer 370, and the common electrode 270 are formed.

The pixel electrode 191 is an anode, which is a hole injection electrode, and the common electrode 270 is a cathode, which is an electron injection electrode. However, embodiments are not limited thereto, and the pixel electrode 191 may be a cathode, and the common electrode 270 may be an anode according to a driving method of the OLED display. When holes and electrons from the pixel electrode 191 and the common electrode 270, respectively, are injected into the organic emission layer 370 and excitons in which the injected holes and electrons are coupled drop from an excited state to a ground state, light is emitted.

The organic emission layer 370 is made of a low polymer organic material or a high polymer organic material such as poly 3,4-ethylenedioxythiophene (PEDOT). Further, the organic emission layer 370 may be formed as a multilayer including at least one of an emission layer, a hole injection layer (HIL), a hole transporting layer (HTL), an electron transporting layer (ETL), and an electron injection layer (EIL). When the multilayer includes all of the emission layer, the HIL, the HTL, the ETL, and the EIL, the HIL is disposed on the pixel electrode 191, which is a positive electrode, and the HTL, the emission layer, the ETL, and the EIL are sequentially stacked thereon. The common electrode 270 is made of a reflective conductive material and becomes a rear light emitting OLED display. As a reflective material, a material such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 110: substrate | 121: scan line |
| 122: previous scan line | 123: light emission control line |
| 124: initialization voltage line | 125a: driving gate electrode |
| 125b: switching gate electrode | 126: first storage capacitor plate |
| 127: second storage capacitor plate | 128: first boosting capacitor plate |
| 129: second boosting capacitor plate | 131: semiconductor layer |

| <Description of symbols> | |
|---|---|
| 141: first gate insulating layer | 142: second gate insulating layer |
| 160: interlayer insulating layer | 171: data line |
| 172: driving voltage line | 174: connection member |

What is claimed is:

1. An organic light emitting diode (OLED) display, comprising:
   a substrate;
   a scan line formed over the substrate configured to transfer a scan signal;
   a data line that intersects the scan line and is configured to transfer a data signal;
   a driving voltage line that intersects the scan line and is configured to transfer a driving voltage;
   a switching thin film transistor (TFT) connected to the scan line and the data line;
   a driving TFT connected to the switching TFT and the driving voltage line, the driving TFT comprising a driving gate electrode;
   an OLED connected to the driving TFT;
   a storage capacitor connected between the driving voltage line and the driving gate electrode, wherein the storage capacitor includes a first storage capacitor plate and a second storage capacitor plate that overlaps the first storage capacitor plate;
   a connection member formed over the first storage capacitor plate;
   a boosting capacitor connected to the storage capacitor,
   wherein the storage capacitor has at least one capacitor opening formed in the second storage capacitor plate,
   wherein the connection member is formed in the at least one capacitor opening, and is configured to connect the driving gate electrode to the first storage capacitor plate.

2. The OLED display of claim 1, wherein the driving TFT further comprises a driving semiconductor layer formed on the substrate, and wherein the driving gate electrode is formed on a first gate insulating layer and a second gate insulating layer that sequentially cover the driving semiconductor layer, the driving gate electrode overlapped with the driving semiconductor layer.

3. The OLED display of claim 2, wherein the storage capacitor comprises:
   the first storage capacitor plate formed over the first gate insulating layer;
   a second gate insulating layer covering the first storage capacitor plate; and
   the second storage capacitor plate formed over the second gate insulating layer.

4. The OLED display of claim 3, further comprising an interlayer insulating layer covering the second storage capacitor plate,
   wherein the driving gate electrode is connected to the first storage capacitor plate through a contact hole positioned within the capacitor opening and formed in the interlayer insulating layer and the second gate insulating layer.

5. The OLED display of claim 4, wherein the driving voltage line is formed over the interlayer insulating layer and is spaced apart from the capacitor opening.

6. The OLED display of claim 5, wherein a first side separation terminal and a second side separation terminal of the driving voltage line are connected to the second storage capacitor plate through a first side contact hole and a second side contact hole, respectively, the first side and the second side contact holes formed in the interlayer insulating layer.

7. The OLED display of claim 1, wherein the connection member is formed in the same layer as the voltage driving line, and wherein the connection member is configured to be parallel to the driving voltage line.

8. The OLED display of claim 7, wherein a first end of the connection member is connected to the driving gate electrode through a contact hole formed in the interlayer insulating layer, and a first intermediate protruding portion of the connection member is connected to the first storage capacitor plate through a contact hole formed in the interlayer insulating layer and the second gate insulating layer.

9. The OLED display of claim 7, further comprising an initialization TFT configured to be turned on according to a previous scan signal received through a previous scan line and further configured to transfer an initialization voltage to a driving gate electrode of the driving TFT,
   wherein a second end of the connection member is connected to an initialization semiconductor layer of the initialization TFT through a contact hole formed in the interlayer insulating layer, the second gate insulating layer, and the first gate insulating layer.

10. The OLED display of claim 7, further comprising a compensating TFT configured to compensate a threshold voltage of the driving TFT and connected to the driving TFT,
    wherein a second intermediate protruding portion of the connection member is connected to a compensation semiconductor layer of the compensation TFT through a contact hole formed in the interlayer insulating layer, the second gate insulating layer, and the first gate insulating layer.

11. The OLED display of claim 7, wherein the boosting capacitor comprises a first boosting capacitor plate extended from the first storage capacitor and a second boosting capacitor plate overlapped with the first boosting capacitor plate and protruded from the scan line.

12. The OLED display of claim 11, wherein the scan line and the driving gate electrode are formed co-planar with the second storage capacitor plate.

13. The OLED display of claim 11, wherein the previous scan line is formed co-planar with the first storage capacitor plate.

14. The OLED display of claim 11, wherein the first storage capacitor plate is formed co-planar with the first boosting capacitor plate, and the second storage capacitor plate is formed co-planar with the second boosting capacitor plate.

15. An organic light emitting diode (OLED) display, comprising:
    a substrate;
    a scan line formed over the substrate configured to transfer a scan signal;
    a data line that intersects the scan line and is configured to transfer a data signal a driving voltage line that intersects the scan line and is configured to transfer a driving voltage;
    a switching thin film transistor (TFT) connected to the scan line and the data line;
    a driving TFT connected to the switching TFT and the driving voltage line, the driving TFT comprising:
       a driving gate electrode, and
       a driving semiconductor layer formed on the substrate, wherein the driving gate electrode is formed on a first gate insulating layer and a second gate insulating layer that sequentially cover the driving semiconductor layer, the driving gate electrode overlapped with the driving semiconductor layer;
an OLED connected to the driving TFT;
a storage capacitor connected between the driving voltage line and the driving gate electrode, wherein the storage capacitor comprises:
  a first storage capacitor plate formed over the first gate insulating layer,
  a second gate insulating layer covering the first storage capacitor plate, and
  a second storage capacitor plate formed over the second gate insulating layer and overlapped with the first storage capacitor plate;
a boosting capacitor connected to the storage capacitor, wherein the storage capacitor has at least one capacitor opening formed in the second storage capacitor plate; and
an interlayer insulating layer covering the second storage capacitor plate,
wherein the driving gate electrode is connected to the first storage capacitor plate through a contact hole positioned within the capacitor opening and formed in the interlayer insulating layer and the second gate insulating layer.

* * * * *